United States Patent [19]

Pascucci

[11] Patent Number: 5,864,562
[45] Date of Patent: Jan. 26, 1999

[54] CIRCUIT FOR TRANSFERRING REDUNDANCY DATA OF A REDUNDANCY CIRCUIT INSIDE A MEMORY DEVICE BY MEANS OF A TIME-SHARED APPROACH

[75] Inventor: Luigi Pascucci, Sesto San Giovanni, Italy

[73] Assignee: SGS-Thomson Microelectronics, S.r.l., Agrate Brianza, Italy

[21] Appl. No.: 869,859

[22] Filed: Jun. 5, 1997

[30] Foreign Application Priority Data

Jun. 6, 1996 [EP] European Pat. Off. .............. 96830323

[51] Int. Cl.⁶ .................................................. G06F 11/00
[52] U.S. Cl. ......................................................... 371/10.2
[58] Field of Search ................................. 371/10.2, 10.3, 371/21.1, 21.6; 365/18, 201, 239

[56] References Cited

U.S. PATENT DOCUMENTS

| | | | |
|---|---|---|---|
| 4,495,603 | 1/1985 | Varshney | 365/233 |
| 4,628,480 | 12/1986 | Floyd | 364/900 |
| 4,803,656 | 2/1989 | Takemae | 371/10 |
| 5,303,192 | 4/1994 | Baba | 371/10 |

FOREIGN PATENT DOCUMENTS

0 668 562 A1  8/1995  European Pat. Off. ........ G06F 11/20

*Primary Examiner*—Vincent P. Canney
*Attorney, Agent, or Firm*—David V. Carlson; Kevin S. Ross; Seed and Berry LLP

[57] ABSTRACT

In a memory device equipped with a redundancy circuit comprising at least one redundancy memory register storing a defective address of a defective memory element and an identifying code suitable for identifying a portion of a matrix of memory elements wherein the defective memory element is located, a circuit for transferring redundancy data of a redundancy circuit inside the memory device is provided. The circuit comprises a shared bus of signal lines provided in the memory device to interconnect a plurality of circuit blocks of the memory device and for transferring signals between the circuit blocks. The shared bus can be selectively to the various circuit blocks, and a bus assignment circuit associated to the redundancy circuit is provided for assigning, during a prescribed time interval of a read cycle of the memory device, the shared bus to the redundancy circuit whereby in the prescribed time interval the identifying code stored in the redundancy memory register can be transferred onto the shared bus.

14 Claims, 5 Drawing Sheets

CIRCUIT FOR TRANSFERRING REDUNDANCY DATA OF A REDUNDANCY CIRCUIT INSIDE A MEMORY DEVICE BY MEANS OF A TIME-SHARED APPROACH

BACKGROUND OF THE INVENTION

The present invention relates to a circuit for transferring redundancy data of a redundancy circuit inside a memory device.

TECHNICAL FIELD

In the field of semiconductor memory devices, it is known to provide additional memory elements which can be used to functionally replace memory elements of a memory matrix which, during the memory device test, prove defective. The additional memory elements are conventionally referred to as "redundancy memory elements". For example, bit lines and/or word lines of redundancy memory cells can be provided to functionally replace bit lines and word lines containing defective memory cells.

A redundancy circuit must be provided for permanently storing the defective addresses, for comparing a current address supplied to the memory device to the defective addresses and for selecting, in case of coincidence, a redundancy bit line or word line in substitution for the defective bit line or word line.

To perform the above mentioned functions, the redundancy circuit must be interconnected to several other circuit blocks: this means that several signal lines must be carried around inside the memory device chip. This makes the design of the physical layout quite complicated and causes an increase in the chip dimensions.

For example, a column redundancy architecture is known wherein a single group of redundancy bit lines is provided for all the packets of bit lines forming the portions of the memory matrix associated to respective output data bits of the output data word of the memory device. A column redundancy architecture of this kind is for example described in EP-A-661636 and EP-A-668562 (both in the name of the same Applicant), which are incorporated herein by reference.

A column redundancy architecture of the type described above requires that, together with the defective bit line addresses, information concerning the packet of bit lines wherein the defective bit line is located is stored. In this way, it is possible to substitute a defective bit line in one of said packets without causing all the bit lines in other packets having the same address as the defective bit line to be automatically substituted too, with an increase of the number of defective bit lines which can be repaired.

The information concerning the packet of bit lines wherein a defective bit line is located is conventionally stored in the form of a digital code: for example, in the case of byte-organized memory devices, a three-bit digital code is sufficient to identify one among the eight portions of the memory matrix associated to the eight output data bits; in the case of a word-organized memory device, a four-bit digital code is instead necessary to identify one among sixteen memory matrix portions.

The identifying digital code is for example used to switch the input of the output buffer associated to the identified matrix portion containing the defective bit line from an output of a sensing circuit associated to such matrix portion, to an output of a redundancy sensing circuit associated to the packet of redundancy bit lines. It can be easily understood that the identifying digital code must be transferred from the region of the chip wherein the redundancy circuit is integrated to, for example, the region of the chip wherein output buffers are integrated. This means that a certain number of signal lines must be routed through the chip. In memory devices of large size, even a single additional signal line involves a significant increase of the chip area.

SUMMARY OF THE INVENTION

In view of the state of the art described, it is an object of the present invention to provide a circuit for transferring redundancy data of a redundancy circuit inside a memory device capable of overcoming the above mentioned problems.

According to the present invention, such object is achieved by means of a circuit for transferring redundancy data of a redundancy circuit inside a memory device, the redundancy circuit comprising at least one redundancy memory register storing a defective address of a defective memory element and an identifying code suitable for identifying a portion of a matrix of memory elements wherein the defective memory element is located, characterized by comprising a shared bus of signal lines provided in the memory device to interconnect a plurality of circuit blocks of the memory device and which can be selectively assigned to said circuit blocks, and a bus assignment circuit associated to the redundancy circuit for assigning, during a prescribed time interval of a read cycle of the memory device, the shared bus to the redundancy circuit whereby in said prescribed time interval the identifying code is transferred onto the shared bus.

The present invention provides for the use of a bus of signal lines already existent in the memory device, for example the signal lines used to transfer output signals of sensing circuits to output buffer circuits, and for the adoption of a time-sharing strategy for assigning said signal lines to the redundancy circuit.

Thanks to the present invention, it is not necessary to provide dedicated signal lines for transferring the identifying code which identifies the portion of the memory matrix wherein the defective memory element (bit line or word line) is located. This is made possible by the provision of a general-purpose shared bus of signal lines provided in the memory device for interconnecting the various circuit blocks, and providing an assignment circuit for assigning the shared bus to the redundancy circuit so that the signal lines of the shared bus can be used to transfer the identifying code from the region of the chip wherein the redundancy circuit is integrated to the region of the chip where the identifying code is to be decoded. This reduces the number of signal lines, makes the design of the physical layout simpler and reduces the area of the memory device chip. Especially in memory devices of large size, the provision of a shared bus of signal lines and bus assignments circuits is less costly, in term of chip area, than the provision of several dedicated signal lines.

BRIEF DESCRIPTION OF THE DRAWINGS

These and other features of the present invention will be made more evident by the following detailed description of a particular embodiment, described as a non-limiting example in the annexed drawings.

DETAILED DESCRIPTION OF THE INVENTION

Figure 1:
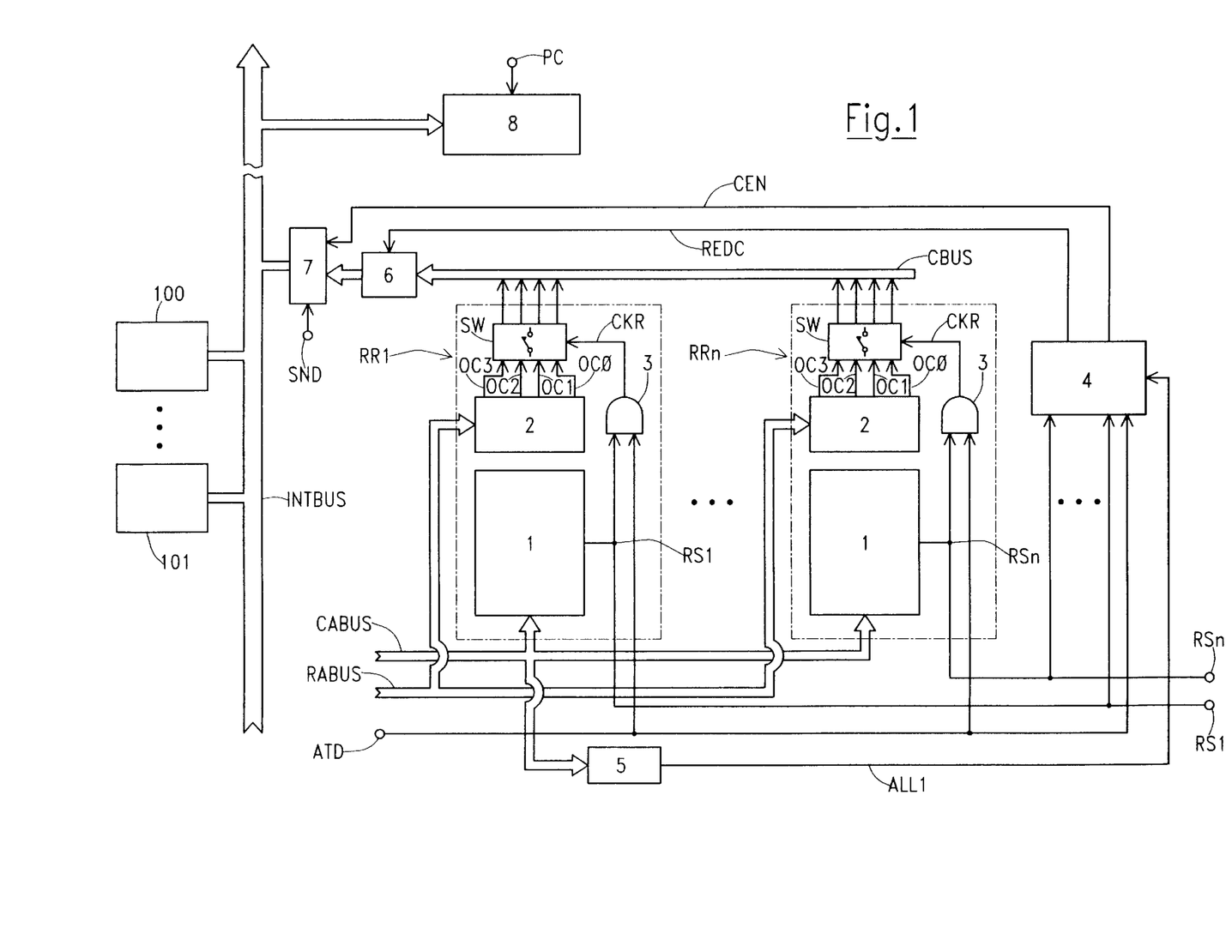
FIG. 1 is a schematic block diagram of a redundancy circuit integrated in a memory device and of a circuit for transferring redundancy data according to the present invention.

With reference to FIG. 1, a redundancy circuit for a memory device is schematically shown in a block diagram. The redundancy circuit conventionally comprises a plurality of redundancy memory registers RR1–RRn, each one capable of storing an address of a defective bit line or word line in a matrix of memory elements (not shown); in the following, the address of a defective bit line or word line will be referred to as a "defective address". As known, each redundancy memory register is generally associated to a respective redundancy bit line or word line, and it controls the selection thereof when it recognizes that a current address supplied to the memory device coincides with the defective address stored therein.

As visible in FIG. 1, each redundancy memory register comprises a first part 1 wherein the defective address is stored, and a second part 2 suitable to store a digital code capable of identifying a portion of the matrix of memory elements wherein the defective bit line or word line is located. Redundancy memory registers of this kind are used for example in a column redundancy circuit for a memory device wherein a single group of redundancy bit lines is provided for all the packets of bit lines forming the portions of the memory matrix associated to respective output data bits of the output data word of the memory device. A column redundancy circuit with redundancy memory registers of the type shown allows the substitution of a defective bit line in one of said packets without causing all of the bit lines belonging to other packets but having the same address as the defective bit line to be automatically substituted too. A column redundancy circuit of this kind is for example described in the European applications incorporated by reference above.

In the following, it will be assumed by way of example that the redundancy circuit is a column redundancy circuit.

The first part 1 of the redundancy memory registers is supplied by a bus CABUS of column address signals, and the second part 2 is supplied by a bus of row address signals RABUS.

The first part 1 of each redundancy register has an output signal RS1–RSn which is activated (high logic level) when the current column address supplied to the memory device and carried by the column address signals of bus CABUS coincides with the defective address stored in the redundancy register. Signals RS1–RSn control in a conventional way the selection of respective redundancy bit lines (not shown).

The second part 2 of each redundancy register has four output signals OC0–OC3 which carry a four-bit digital code memorized in the second part 2 of the redundancy register, identifying the portion of the memory matrix wherein the defective bit line whose address is stored in the first part 1 of the redundancy register is located. It is to be noted that a four-bit digital code identifies one matrix portion among sixteen, as in the case of a memory device having a sixteen-bit external data bus. For memory devices having an eight-bit external data bus, a three-bit digital code is sufficient to identify a matrix portion among eight.

The four signals OC0–OC3 supply an array of switches SW (four in the present example) which selectively connect the four signals OC0–OC3 to respective signal lines of a local code bus CBUS. Switches SW are controlled by an output signal of an AND gate 3 having a first input supplied by the respective signal RS1–RSn, and a second input supplied by a first internal timing signal ATD which will be better described in the following. When both signal RS1–RSn and the internal timing signal ATD are logic "1"s, the output CKR of AND gate 3 is activated and the switches SW close to connect signals OC0–OC3 to the respective signal lines of the local code bus CBUS.

Signals RS1–RSn of all the redundancy registers also supply a redundancy detector 4 which is also supplied by the first internal timing signal ATD and by a signal ALL1 which is generated by an address configuration detector 5 supplied by the signals of the column address bus CABUS.

The redundancy detector 4 generates two signals REDC and CEN: signal REDC controls a pull-up circuit 6 for the signal lines of the local code bus CBUS. The output signals of the pull-up circuit 6 and the signal CEN supply an interface circuit 7 which selectively connects the signal lines of the local code bus CBUS and the signal line CEN to respective signal lines of a general-purpose shared bus INTBUS provided in the memory device for carrying signals through the memory device chip. Bus INTBUS is a shared bus internal to the memory device which can be assigned, by means of a time-sharing strategy, to several other circuit blocks 100, 101 of the memory device to transfer signals from regions of the chip wherein they are generated to regions of the chip wherein said signals are to be used; bus INTBUS is thus suitable to replace several dedicated signal lines which would otherwise be necessary to transfer all the different signals. Advantageously, bus INTBUS could be represented by the signal lines normally provided in a memory device for transferring read data signals from the outputs of the sensing circuits to the output buffer circuits of the memory device. In the present example, bus INTBUS transfers the signals of the local code bus CBUS from the region of the chip wherein the column redundancy circuit is integrated to another region of the chip, for example near the output buffers of the memory device, wherein the identifying code memorized in the redundancy registers is to be decoded; since bus INTBUS is a shared bus, some kind of memory register 8 shall be provided to store the redundancy identifying code as long as such a code is present on the bus INTBUS and before the bus INTBUS is assigned to another resource. Memory register 8 generically comprises a set of memory elements such as, for example, flip-flops.

The interface circuit 7 is controlled by a second timing signal SND, and the memory register 8 is controlled by a third timing signal PC. The timing of signals SND and PC will be described in detail in the following.

Figure 2:
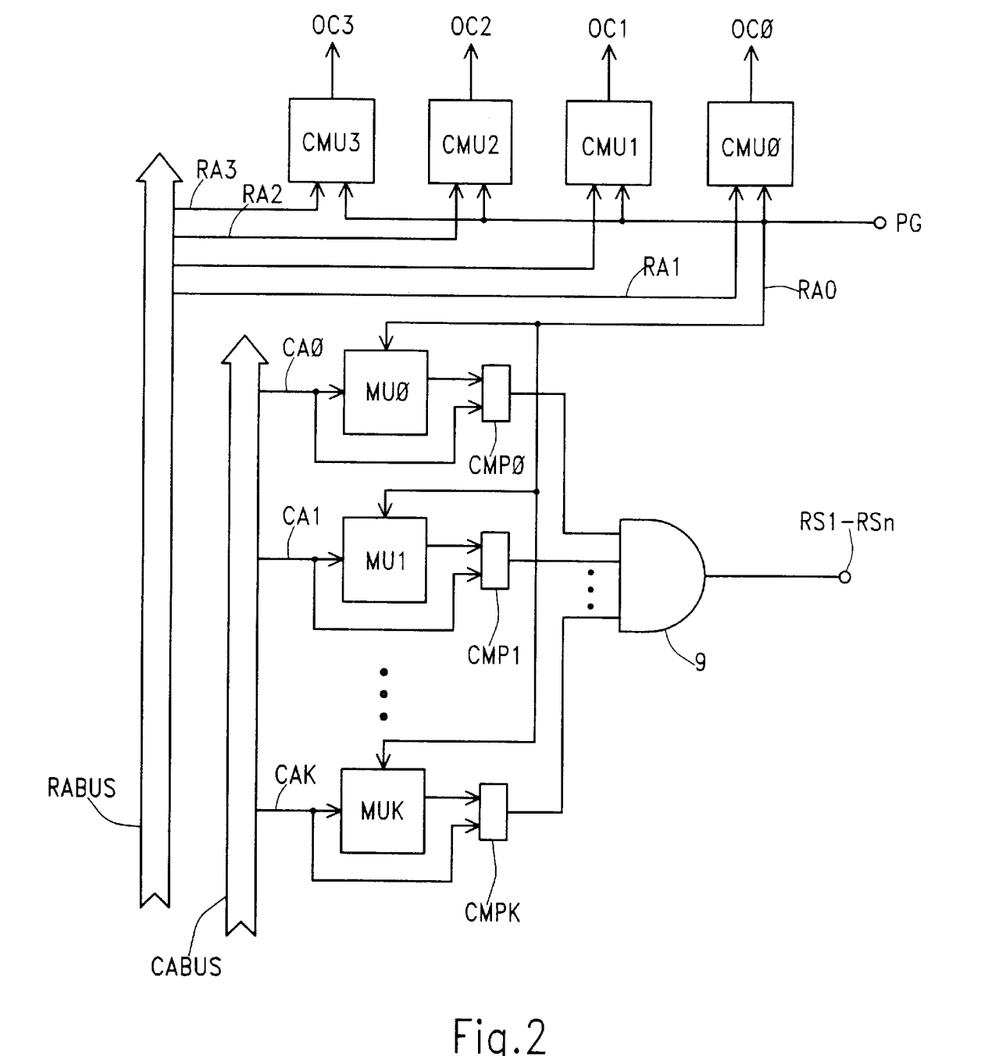
FIG. 2 is a schematic block diagram of a redundancy memory register.

FIG. 2 is a schematic block diagram of one of the redundancy memory registers RR1–RRn. It comprises a plurality of memory units MU0–MUk, each one associated to a respective signal CA0–CAk of the column address signal bus CABUS. Each memory unit MU0–MUk is capable of storing a respective bit of a defective bit line address, and has an output signal which is supplied to a respective digital comparator CMP0–CMPk together with the respective column address signal CA0–CAk. Each digital comparator has an output signal which is activated (high logic level) when the respective current column address signal coincides with the defective address bit stored in the respective memory unit. The output signals of the digital comparators CMP0–CMPk supply an AND gate 9 whose output signal forms the signal RS1–RSn and which is activated (high logic level) when all the output signals of the digital comparators CMP0–CMPk are activated, i.e., when the current column address coincides with the defective address stored in the memory units MU0–MUk.

The redundancy memory register also comprises four (in this example) further memory units CMU0–CMU3 storing the four-bit digital code suitable for identifying the portion of the memory matrix wherein the defective bit line whose address is stored in the memory units MU0–MUk is located. Each one of the memory units CMU0–CMU3 has a respective output signal OC0–OC3.

The four memory units CMU0–CMUk are supplied by respective row address signals RA0–RA3 of the row address signal bus RABUS and by a program enable signal PG. When signal PG is activated, the datum carried by the respective row address signal RA0–RA3 is stored in the respective memory unit CMU0–CMU3. Signal PG also supplies the memory units MU0–MUk, each of which is also supplied by the associated column address signal CA0–CAk. When signal PG is activated, the datum carried by a column address signal CA0–CAk is stored in the respective memory unit MU0–MUk.

Figure 3:
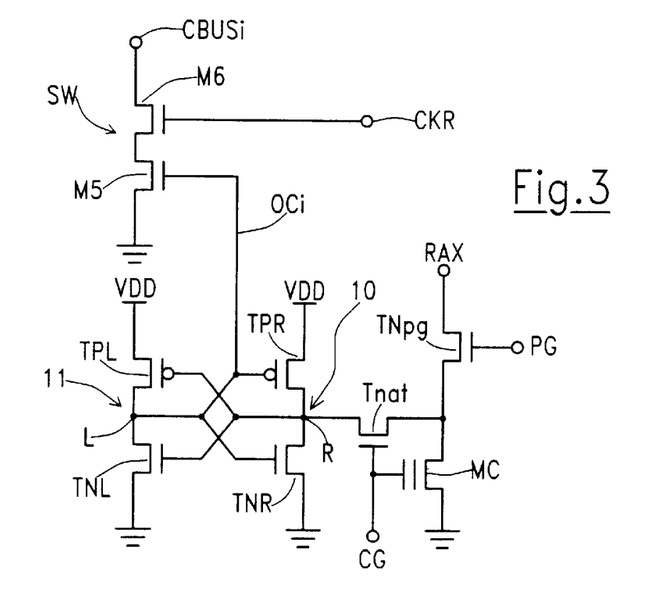
FIG. 3 is a circuit diagram of a memory unit of the redundancy memory register.

FIG. 3 shows the structure of one of the memory units CMU0–CMU3. The circuit comprises a programmable memory element MC, in this example a floating-gate MOS transistor of the type used to form EPROM memory cells, with source connected to ground, drain coupled to a respective row address signal line RAx through a decoupling transistor TNpg, and control gate controlled by a control signal CG.

The circuit also comprises a bistable latch having a right branch 10 and a left branch 11. The right branch 10 comprises a P-channel MOSFET TPR and an N-channel MOSFET TNR connected in series between a voltage supply VDD (typically a 5 V or a 3 V voltage supply) and ground. The left branch 11 comprises a P-channel MOSFET TPL and an N-channel TNL connected in series between VDD and ground. A common node R of TPR and TNR in the right branch 10 is connected to gate electrodes of TPL and TNL in the left branch 11; a common node L of TPL and TNL in the left branch 11 is connected to gate electrodes of TPR and TNR in the right branch 10. Node R is also connected, through an N-channel MOSFET Tnat controlled by the control signal CG, to the drain of the floating-gate MOS transistor MC. Node L forms the output signal OCi (i=0 . . . 3) of the memory unit.

In FIG. 3 one switch of the array SW is also shown: the switch comprises two N-channel MOSFETs M5 and M6 connected in series between a respective signal line CBUSi of the local code bus CBUS and ground. MOSFET M5 is controlled by node L, and MOSFET M6 is controlled by the output signal CKR of NAND gate 3 shown in FIG. 1.

The two branches 10, 11 of the bistable latch are not perfectly symmetric: the P-channel MOSFET TPR in the right branch is fabricated to have a threshold voltage lower (in absolute value) than the threshold voltage of P-channel MOSFET TPL in the left branch; for example, TPR has a threshold voltage of approximately −0.9V while TPL has a threshold voltage of approximately −1.6V. Also, the N-channel MOSFET TNR in the right branch is fabricated to have a threshold voltage higher than the threshold voltage of the N-channel MOSFET TNL in the left branch; for example, TNR has a threshold voltage of approximately 0.8V while TNL has a threshold voltage of approximately 0.4V. The bistable latch is therefore unbalanced.

The row address signal line RAx can take digital voltage levels of 0V and 5V or 3V.

Signal PG is normally kept at zero volts, but it is raised to approximately 12V when the memory element MC must be programmed. Signal CG is normally kept at 5V (or lower), but it is raised to approximately 12V when MC must be programmed.

To program the memory element MC, signals CG and PG are raised to approximately 12 V; if the datum carried by line RAx is a logic "0", the potential on the drain of MC is zero volts, and MC does not program. If instead the datum carried by line RAx is a logic "1", the potential on the drain of MC is 5V, electrons are injected into the floating gate of MC and the threshold voltage of MC increases.

At the circuit power-up, when the voltage supply VDD raises from zero volts to the prescribed value of 5V or 3V, node L in the left branch sets low and node R in the right branch sets high; this is made possible by the very fact that the bistable latch is unbalanced as previously described.

If the memory element MC is programmed (high threshold voltage), it will not drain current, node R remains high and node L remains low: MOSFET M5 is therefore kept off. If instead MC is not programmed (virgin), it will drain current from MOSFET TPR in the right branch 10; node R is pulled toward ground, TPL turns on and the potential of node L rises toward VDD; MOSFET M5 is therefore turned on.

MOSFET Tnat is useful during the initial setting of the bistable latch at the power-up (when R goes high) to limit the voltage on the drain of MC.

Figure 4:
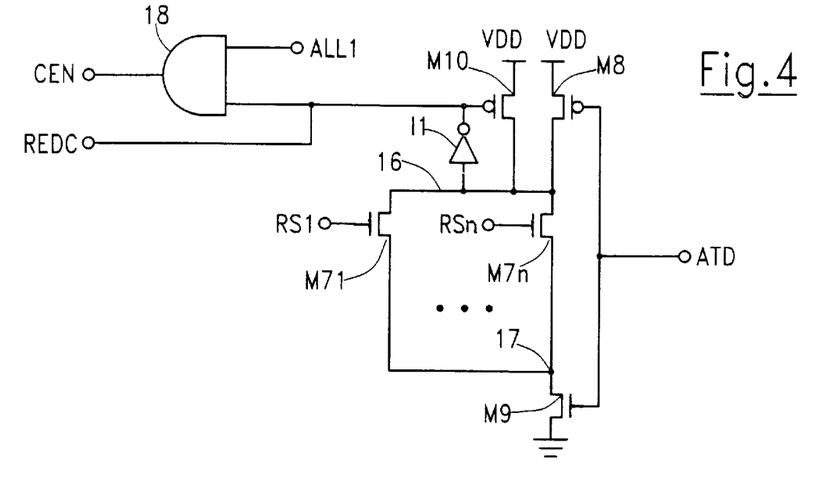
FIG. 4 is a circuit diagram of a redundancy detector.

FIG. 4 shows the structure of the redundancy detector 4. Each one of the signals RS1–RSn supplies a gate electrode of a respective N-channel MOSFET M71–M7n. All the MOSFETs M71–M7n are connected in parallel to each other between a drain electrode 16 of a P-channel MOSFET M8 and a drain electrode 17 of an N-channel MOSFET M9; M8 has a source electrode connected to VDD, M9 has a source electrode connected to ground; M8 and M9 are controlled by the first timing signal ATD. The drain electrode 16 of M8 is supplied to an input of an inverter I1 whose output forms the signal REDC. Inverter I1 also controls a P-channel MOSFET M10 connected between VDD and the drain electrode 16 of M8. Signal CEN is the output of an AND gate 18 whose inputs are represented by signals REDC and ALL1.

Figure 5:
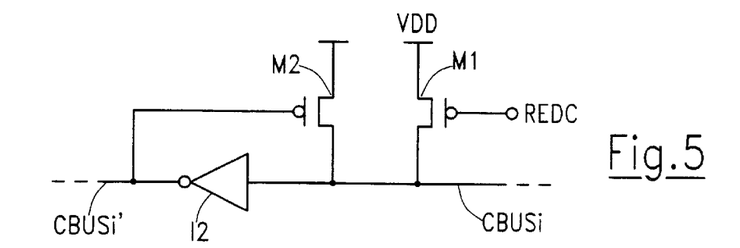
FIG. 5 is a circuit diagram of a pull-up circuit for a bus of local signals of the redundancy circuit of FIG. 1.

FIG. 5 shows the structure of an element of the pull-up circuit 6. CBUSi represents one of the four signal lines of the local code bus CBUS. A P-channel MOSFET M1 is connected between signal line CBUSi and the voltage supply VDD, and is controlled by the signal REDC. A further P-channel MOSFET M2 is also connected between the signal line CBUSi and the voltage supply VDD. Signal line CBUSi supplies a CMOS inverter 12 whose output controls MOSFET M2. The output CBUSi' of inverter 12 supplies the interface circuit 7. The pull-up circuit comprises four circuits identical to that shown in FIG. 5, one for each of the four signal lines of the local code bus CBUS. MOSFET M1 prevents the signal lines CBUSi of the local code bus from remaining floating when switches SW are open; MOSFET M2 prevents the signal lines CBUSi from remaining floating when switches SW are closed but signals OC0–OC3 are logic "0"s.

Figure 6:
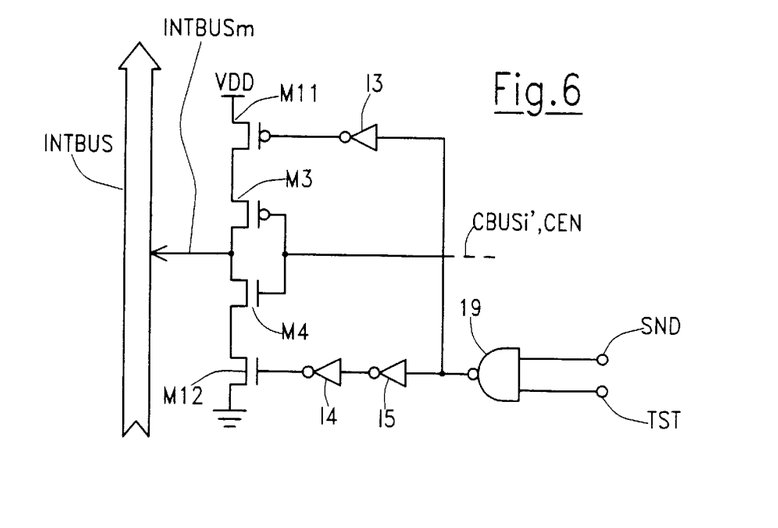
FIG. 6 is a circuit diagram of an interface circuit for interfacing the local signals to a general-purpose bus of signals of the memory device.

FIG. 6 shows the structure of an element of the interface circuit 7. The circuit comprises a CMOS inverter comprising a P-channel MOSFET M3 and an N-channel MOSFET M4 connected in series and controlled by signal CBUSi'. A common node of MOSFETs M3 and M4 drives a respective signal INTBUSm of the shared bus INTBUS. A source electrode of MOSFET M3 is coupled to VDD by means of a P-channel MOSFET M11 controlled by an output of an inverter I3 which is in turn driven by an output of a NAND gate 19 supplied by the second timing signal SND and by a test signal TST (Formally kept at the high logic level). A source electrode of MOSFET M4 is coupled to ground by means of an N-channel MOSFET M12 controlled by an output of a cascade of two inverters 14 and 15 supplied by the output of the NAND gate 19. M3, M4, M11 and M12 form a tri-state inverter, i.e., an inverter which can be put in a high-impedance mode for isolating the signal line INTBUSm from the signal line CBUSi'.

The interface circuit 7 comprises five elements having the structure shown in FIG. 6: four elements for interfacing the four signal lines of the local code bus CBUS to respective signal lines of the general-purpose shared bus INTBUS, and an element for interfacing the signal CEN to a respective signal line of bus INTBUS.

Figure 7:
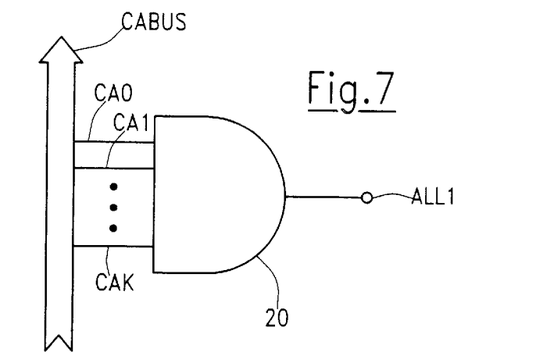
FIG. 7 is a circuit diagram of an address configuration detector.

FIG. 7 shows the structure of the address configuration detector 5; substantially, the circuit is a decoder comprising an AND gate 20 supplied by all the column address signals CA0–CAk. The output signal ALL1 of the AND gate 20 is activated when CA0=CA1= . . . =CAk="1". Any other known arrangement of logic gates can however be used to generate the signal ALL1.

Figure 8:
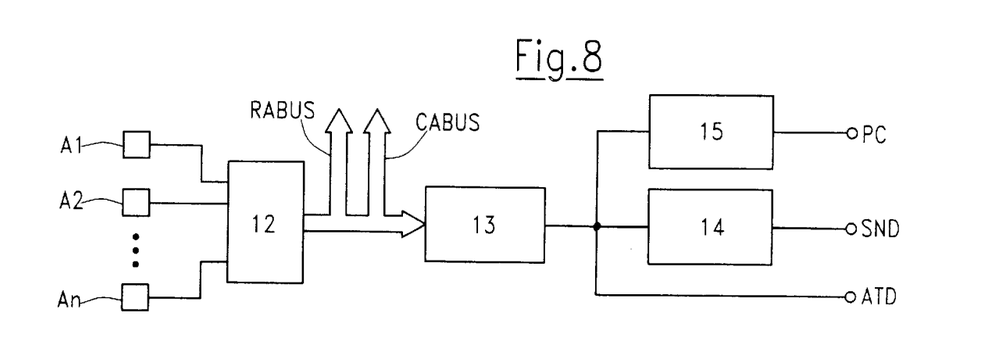
FIG. 8 is a schematic block diagram of an internal timing signal generator.

FIG. 8 is a schematic block diagram showing the circuits for the generation of the first, second and third timing signals ATD, SND and PC. Signals supplied to address input terminals A1, A2 . . . An of the memory device supply a per-se known address buffer circuit 12 which generates the address signals of the bus ADD, formed by the row address signals and the column address signals. The address signals ADD are conventionally supplied to an address transition detector circuit 13 which, upon transition of at least one of the address signals ADD, activates the first timing signal ATD; signal ATD switches to the low logic level and remains at the low logic level for a prescribed time, then it returns to the high logic level. Signal ATD supplies a circuit 14 which generates the second timing signal SND; signal SND is normally at the high logic level, and goes to the low logic level when the ATD signal goes low; signal SND remains at the low logic level for a prescribed time longer than that of signal ATD. Signal ATD also supplies another circuit 15 which generates the third timing signal PC; signal PC is normally at the high logic level, and goes to the low logic level when the ATD signal goes low; signal PC remains at the low logic level for a prescribed time which is longer than that of the signal ATD, but is a little shorter than that of signal SND. Signal PC is conventionally used for example to precharge the bit lines of the memory matrix at the beginning of a read operation, and for setting the sensing circuits of the memory device in a prescribed initial state. Circuits 13, 14 and 15 can be for example monostable circuits.

Figure 9:
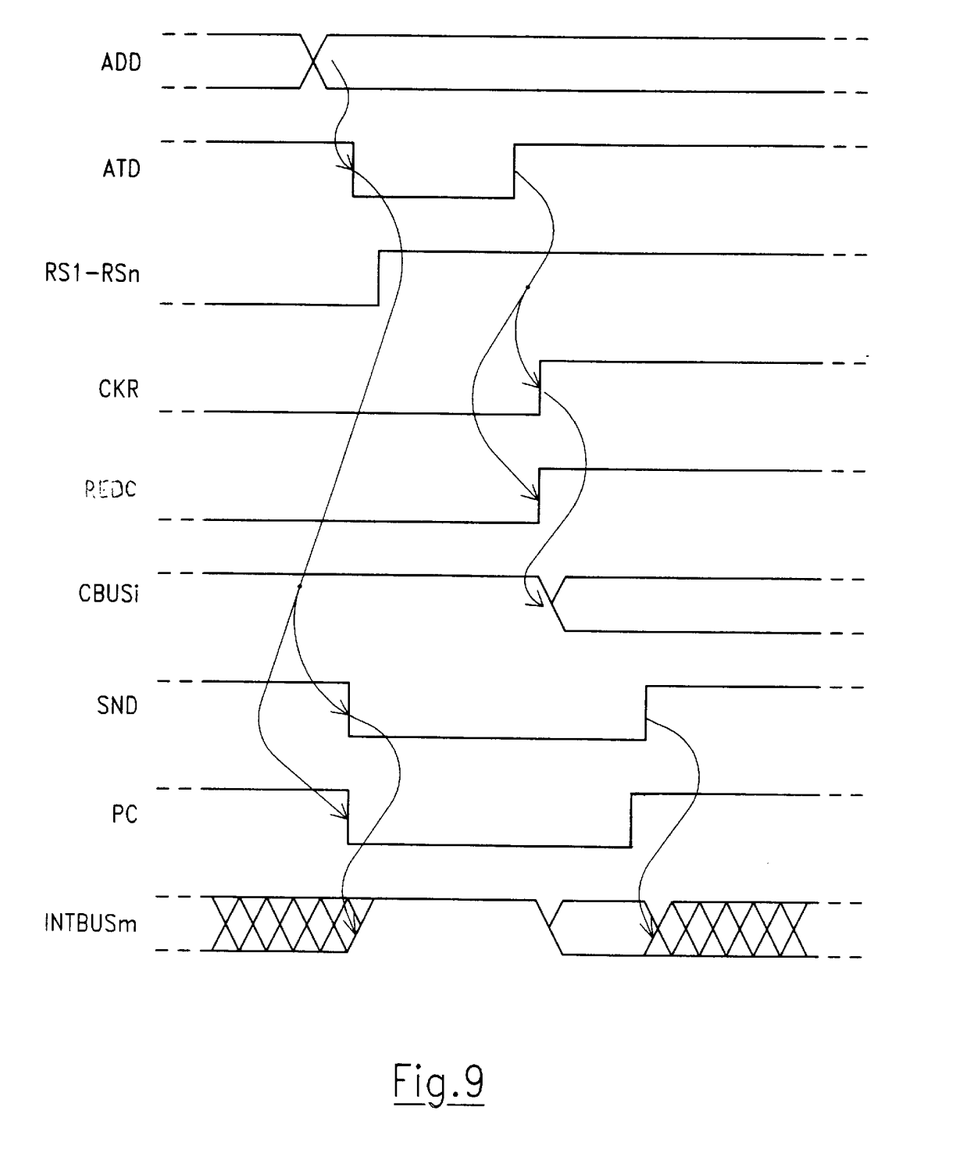
FIG. 9 is a timing diagram of some signals of the redundancy circuit.

The operation of the circuit described above will be now explained making reference to the timing diagram of FIG. 9.

A read cycle of the memory device starts when one or more of the address input signals A1–An changes. The corresponding signals of the ADD bus change logic level. This causes the activation of signal ATD, which goes to the low logic level and remains low for a prescribed time. The high-to-low transition of the ATD signal causes the activation of signals SND and PC, which go to the low logic level.

As long as the ATD signal is at the low logic level, MOSFETs M8 and M9 in the redundancy detector 4 are kept on and off, respectively. Signal REDC is kept at the low logic level and signal CEN is consequently kept at the low logic level too. Signals CKR in the redundancy registers RR1–RRn are kept at the low logic level, and the switches of the arrays SW are open (MOSFET M6 in FIG. 3 is kept off). The output signals OC0–OC3 of all the redundancy registers RR1–RRn are decoupled from the signals of the local code bus CBUS. The signals of the local code bus CBUS are not left floating, being pulled up toward VDD by MOSFETs M1 in the pull-up circuit 6, which are kept on by signal REDC.

Before signal SND goes low, the interface circuits 7 are in the high-impedance mode (MOSFETs M11 and M12 are kept off), and the signal lines CBUSi' and CEN are isolated from the respective signal lines of the shared bus INTBUS; the latter can thus be assigned to other resources of the memory device, such as those schematically indicated by blocks 100 and 101 in FIG. 1. As soon as signal SND goes low, the interface circuits 7 exit the high-impedance mode, and signal lines CBUSi' and CEN are connected to the respective signal lines of bus INTBUS.

If the current address supplied to the memory device is not a defective address, no one of the signals RS1–RSn will be activated and all the signals CKR will be kept at the low logic level; also, no one of MOSFETs M71–M7n in the redundancy detector circuit 4 will be turned on.

When the ATD signal returns to the high logic level, MOSFETs M8 and M9 in the redundancy detector 4 are turned off and on, respectively, but signals REDC and CEN do not change their logic level, because no one of MOSFETs M71–M7n is in the on state. Signal CEN is used to detect if the current address is a defective address: if CEN="0", the current address is not defective. Also, all the signals CKR remain at the low logic level, so that all the switches of the arrays SW are kept open: the signals CBUSi of the local code bus CBUS are therefore pulled up to VDD by MOSFET M1.

If differently the current address supplied to the memory device is a defective address, the redundancy memory register wherein said defective address is stored activates the respective signal RS1–RSn. One of the MOSFETs M71–M7n will be therefore turned on, but as long as the ATD signal is at the low logic level the signals REDC and CEN remains at the low logic level. When the ATD signal returns to the high logic level, the switches SW in the redundancy memory register wherein the defective address is stored close, connecting the output signals OC0–OC3 of the memory units CMU0–CMU3 to the respective signal lines CBUSi of the local code bus CBUS. In addition, when the ATD signal returns to the high logic level, node 16 in the redundancy detector 4 will be pulled to ground by the MOSFET M71–M7n which is associated to the redundancy memory register wherein the defective address is stored. Signals REDC and CEN switch to the high logic level, and MOSFET M1 are turned off. If the memory element MC in a given memory unit CMU0–CMU3 is programmed, node L (FIG. 3) is at the low logic level and MOSFET M5 is off; the respective signal line CBUSi of the local code bus is pulled to VDD by MOSFET M2, and the signal line CBUSi' is at the low logic level. If instead the memory element MC of the memory unit CMU0–CMU3 is virgin, node L is at the high logic level and MOSFET M5 is on; the respective signal line is thus pulled to ground, signal line CBUSi' switches to the high logic level and MOSFET M2 is turned off.

As long as signal SND remains at the low logic level, the shared bus INTBUS is assigned to the redundancy circuit, and the data of the code identifying the portion of the memory matrix wherein the defective bit line is located are present on respective signal lines of the bus INTBUS.

Before signal SND returns to the high logic level, signal PC returns to the high logic level, causing the memory register 8 to memorize the data of the matrix portion identifying code and the state of signal CEN. Signal CEN, when activated ("1") signals that the current address is a defective address and that the data stored in the memory register 8 are an identifying code of the matrix portion wherein the defective bit line is located.

When also signal SND returns to the high logic level, the general-purpose shared bus INTBUS is no longer assigned to the redundancy circuit, but the relevant data has already been transferred from the redundancy memory registers RR1–RRn to the memory register 8 located in the region of the chip wherein said data are to be used.

The current address supplied to the memory device can be such that the configuration of the column address signals CA0–CAk corresponds to a default configuration stored in the redundancy memory registers which have never been programmed because they have not been used. In this example, this configuration is assumed to be CA0=. . . =CAk="1". In this case, the selection of the redundancy bit lines associated to the unused redundancy memory registers must be prevented, because otherwise it could happen that if more than one unused redundancy memory register exist, more than one redundancy bit line would be selected at the same time. To this purpose, the address configuration detector 5 activates the signal ALL1 which prevents the activation of signal CEN.

Test signal TST is normally at the high logic level, but it is activated, at the low logic level, in a particular test condition to force the assignment of the general-purpose shared bus INTBUS to the redundancy circuit, independently of the state of the timing signal SND.

I claim:

1. A circuit for transferring redundancy data of a redundancy circuit inside a memory device, the redundancy circuit comprising:

at least one redundancy memory register storing a defective address of a defective memory element and an identifying code suitable for identifying a portion of a matrix of memory elements wherein the defective memory element is located;

a shared bus of signal lines provided in the memory device to interconnect a plurality of circuit blocks of the memory device and for transferring signals between said circuit blocks, the shared bus being selectively assignable to said circuit blocks; and a bus assignment circuit associated to the redundancy circuit for assigning, during a prescribed time interval of a read cycle of the memory device, the shared bus to the redundancy circuit whereby in said prescribed time interval the identifying code stored in the redundancy memory register can be transferred onto the shared bus.

2. The circuit according to claim 1 wherein said bus assignment circuit comprises:

interface means for coupling signal lines carrying said identifying code to respective signal lines of the shared bus, said interface means being normally deactivated for isolating said signal lines carrying the identifying code from said respective signal lines of the shared bus and being activated during said prescribed time interval.

3. The circuit according to claim 2 wherein said interface means are activated by a first timing signal which is activated upon changing of an address configuration supplied to the memory device and which remains activated during said prescribed time interval.

4. The circuit according to claim 1 wherein the redundancy circuit comprises a plurality of redundancy memory registers and a local bus, each redundancy memory register comprising respective switching means for selectively transferring the respective identifying code stored therein to the local bus, said switching means being activated when a current address supplied to the memory device coincides with a respective defective address stored in the respective redundancy memory register.

5. The circuit according to claim 4 wherein the each redundancy memory register generates a respective redundancy selection signal which is activated when a current address supplied to the memory device coincides with a defective address stored in the respective redundancy memory register, the redundancy circuit comprising redundancy detector means activating a redundancy detection signal when anyone of the redundancy selection signals is activated, the redundancy detection signal being coupled, by means of said interface means, to a respective signal line of the shared bus.

6. The circuit according to claim 1 wherein said shared bus is a bus of signal lines provided in the memory device to transfer read data signals generated by a plurality of sensing circuits of the memory device to a respective plurality of output interface circuits of the memory device.

7. A circuit for routing redundancy data in a memory device having redundant memory elements for replacing defective portions of the memory device, comprising:

a redundancy memory register for storing an address of a defective group of memory elements, and for storing a location code identifying which portion of the memory device contains the defective group;

a general-purpose shared data bus coupled to the redundancy memory register and other peripheral circuits within the memory device, the shared data bus for transferring signals including the location code for use by the peripheral circuits for the operation of the memory device during a portion of a memory access cycle; and control circuitry for connecting to and disconnecting from the redundancy memory register the shared data bus during prescribed periods of time during the memory access cycle.

8. The circuit of claim 7 wherein the control circuitry comprises:

a redundancy detector coupled to the redundancy memory register, the redundancy detector for generating a redundancy signal if a current address matches the address of the defective group in the memory device;

a pull-up circuit for accepting the redundancy signal and transferring the location code to a shared bus interface circuit; and the shared bus interface circuit for placing the location code signals on the shared bus.

9. The circuit of claim 8 wherein the shared bus interface circuit places the location code signals on the shared bus during the prescribed time period when no other signals are on the shared bus.

10. The circuit of claim 7 wherein the location codes are read from the shared bus by a memory register.

11. The circuit of claim 7 wherein the redundancy memory register comprises:

a plurality of sets of memory units, each set for storing a memory address;

each memory unit in each set coupled to a comparator for generating an activation signal when a stored signal in the memory unit matches a respective column address bit signal on a column address bus;

a logic gate which generates a matching signal when every comparator produces an activation signal; and a second plurality of sets of memory units, each for identifying a location in the memory device which contains a defective portion.

12. A method for transferring redundancy data from a redundancy circuit inside a memory device comprising the steps of:

comparing a current address to a stored address of a known defective portion of the memory device;

generating a redundancy signal if the current address matches the stored address;

placing the redundancy data on a shared bus that couples a plurality of circuits in the memory device when the redundancy signal is generated and during a preselected portion of a memory access cycle; and reading the redundancy data from the shared data bus.

13. The method of claim 12, further comprising the step of storing the redundancy data in a memory register within the memory device after it has been read from the shared data bus.

14. The method of claim 12 wherein the shared bus is dedicated to the redundancy data during the preselected time period and dedicated to other of the circuits of the memory device during other times of the cycle.

* * * * *